Feb. 16, 1965 H. J. GOULD 3,169,304

METHOD OF FORMING AN OHMIC SEMICONDUCTOR CONTACT

Filed June 22, 1961

HERBERT J. GOULD,
INVENTOR.

BY
Barlaler + Lewis

United States Patent Office 3,169,304
Patented Feb. 16, 1965

3,169,304
METHOD OF FORMING AN OHMIC SEMICONDUCTOR CONTACT

Herbert J. Gould, Temple City, Calif., assignor to Giannini Controls Corporation, Duarte, Calif., a corporation of New York
Filed June 22, 1961, Ser. No. 118,944
2 Claims. (Cl. 29—155.5)

This invention has to do generally with semiconductors and their utilization in electric circuits, and concerns more particularly improved methods of producing substantially ohmic contacts at surfaces of p-type silicon.

Procedures are already available for producing satisfactory ohmic contacts at surfaces of silicon of n-type. For example, nickel may be deposited on such surfaces by electroless deposition from suitable aqueous solutions. An electrical conductor may then be connected in any suitable manner.

It is well known that the quality of such ohmic contacts on n-type silicon can be improved by firing the nickel coated semiconductive element to diffuse nickel atoms an appreciable distance into the body of the silicon.

Corresponding treatment of p-type silicon does not produce satisfactory ohmic contacts. Instead, a barrier layer of high impedance is typically formed between the p-type silicon and the surface layer of nickel. The high impedance layer appears to be due to diffusion into the body of the semiconductor of impurities of donor type from the solution employed for the electroless deposition of nickel. Such solutions typically contain compounds of the donor element phosphorus. Diffusion of such a donor element may produce a region of n-type silicon immediately below the surface layer of nickel. The resulting pn junction has rectifying properties and prevents satisfactory ohmic conduction from the contact into the body of the silicon.

Previous attempts to prevent the formation of such barrier layers in p-type silicon have not been satisfactory. One proposed method is to first diffuse a heavy concentration of atoms of acceptor type into a shallow surface region of the silicon. Ideally, it should be possible to supply sufficient acceptor atoms to counteract the donor impurity introduced during subsequent electroless deposition of nickel. However, in practice that has proved difficult or impossible, at least without using a large excess of acceptor atoms which is inherently objectionable.

Such previous procedures are especially unsatisfactory when it is desired to fire the deposited nickel layer. The resulting diffusion of the various impurities then tends to alter both their depth and concentration in different and relatively complex ways, making accurate and reliable compensation even more difficult to attain.

In accordance with the present invention those difficulties are avoided, and highly satisfactory ohmic contacts on p-type silicon are produced by depositing simultaneously a layer of nickel and a suitable concentration of acceptor atoms, just sufficient to prevent formation of a barrier layer.

In preferred form of the invention, a doping agent of acceptor type is incorporated in suitable chemical form directly in the solution from which the nickel layer is deposited. That procedure has the great advantage that the proportions in which acceptor atoms and donor atoms are deposited on the silicon surface depends primarily upon the composition of the solution. The nature of the nickel layer can be varied appreciably, as by selection of the temperature and time of treatment, without departing significantly from accurate compensation.

Moreover, simultaneous deposition of the n-type impurity, such as phosphorus, and the compensating p-type additive has the great advantage that all treatments following their deposition, such as firing, for example, act equally upon them. Especially since the two atomic species have closely equal rates of diffusion, accurate compensation is not affected by the diffusion that accompanies heat treatment.

A full understanding of the invention, and of its further objects and advantages, will be had from the following description of certain illustrative manners of carrying it out. The particulars of that description, and of the accompanying drawings which form a part of it, are intended only for illustration, and not as a limitation upon the scope of the invention, which is defined in the appended claims.

Figure 3:
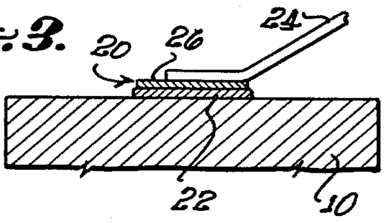
FIG. 3 is a section corresponding to FIGS. 1 and 2 and representing a completed illustrative contact.

An illustrative ohmic contact in accordance with the invention is indicated generally at 20 in FIG. 3. Contact 20 comprises a layer of metallic nickel 22, formed by electroless deposition from a solution to be more fully described. A conductor 24 is typically connected to nickel layer 22, as by first depositing a relatively thick and stable support layer 26 of gold, for example, to which conductor 24 may be soldered or otherwise connected in any desired manner.

It is to be understood that the various layers are greatly exaggerated in the drawings for clarity of illustration. For example, the thickness of nickel layer 22 is typically measured in hundreds of Angstroms, rather than in inches.

Figure 1:
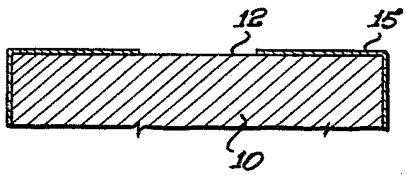
FIG. 1 is a schematic fragmentary section representing a portion of a silicon element on which a contact may be formed.

Before depositing nickel layer 22, the limited surface area 12 at which the contact is to be formed is typically defined, as by first coating the remaining surface of element 10 with a suitable water-impermeable protective coating, as indicated at 15 in FIG. 1. Coating 15 may be of conventional type, and is applied in any suitable manner, as by painting, by evaporation in vacuum, or by known photographic techniques, for example.

Element 10, with its water impervious coating 15, is then immersed in a nickel plating bath to which has been added a suitable concentration of a doping agent of acceptor type. A suitable bath for that purpose is of the following illustrative composition, expressed in grams of solute per liter of water:

| | G. |
|---|---|
| $NiCl_2 \cdot 6H_2O$ | 30 |
| $NaH_2PO_2 \cdot H_2O$ | 10 |
| $(NH_4)_2HC_6H_5O_7$ | 65 |
| $NH_4Cl$ | 50 |
| $H_3BO_3$ | 10 |

At suitable elevated temperature, such as 90° C., for example, such a solution deposits on the exposed silicon surface 12 material of three different types. The primary action quantitatively is deposition of nickel, due to oxidation of the sodium hypophosphite to phosphate and reduction of nickel chloride catalyzed by the metal surface. The ammonium citrate and chloride perform their usual roles as buffering agents. Secondly, a miner proportion of phosphorus is also deposited on the surface. Thirdly, atomic boron is deposited on the surface.

A suitable deposit of nickel is typically several hundred Angstroms thick, and may normally be obtained in approximately 5 to 10 minutes, but the time and temperature may be varied considerably to meet special conditions. The boron may be supplied to the solution any form that causes deposition of boron at the silicon surface. Part or all of the boric acid of the illustrative formula given above may, for example, be replaced by an alkaline compound such as sodium metaborate, or sodium tetraborate (borax). The amount of boron made available for diffusion into the silicon lattice may be varied as required by variation of the concentration of the selected boron source in the solution. The boric acid concentration of 10 g. per liter, mentioned above, is illustrative, and represents a normally satisfactory value. Under special conditions a different concentration may be found preferable, usually between about 2 and about 20 grams per liter.

After electroless deposition of the nickel layer, the silicon element is washed and dried in conventional manner. Protective coating 15 may then be removed in the usual way.

If it is desired to fire the silicon element and the nickel film to improve the adherence and other properties, such firing may be carried out in the usual manner in a suitable oven in an inert atmosphere such as nitrogen or helium. Treatment for about 5 minutes at approximately 800° C. is illustrative of such firing procedures, though widely varying degrees of treatment are useful.

During such firing, the nickel layer becomes more firmly bound to the silicon surface. Also, the elevated temperature causes both the phosphorus contamination of the surface and the boron atoms deposited thereon from the boron-containing additive in the nickel plating solution to diffuse relatively rapidly ito the body of the silicon.

Figure 2:
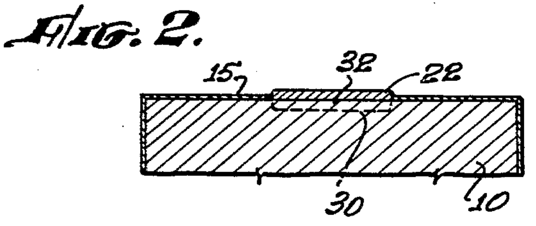
FIG. 2 is a section corresponding to FIG. 1, illustrating an intermediate stage of applicant's process.

An important feature of the invention is that the diffusion rates of the donor phosphorus atoms and the acceptor boron atoms are substantially equal. Accordingly, after any specific firing operation that may be selected, the forward diffusion boundaries of the respective atom types are substantially coincident, as indicated schematically by the dashed line 30 in FIG. 2. Within the region 32 between forward boundary 30 and nickel layer 22 the concentrations of phosphorus and boron atoms vary widely, but substantially proportionally. Hence, with suitable selection of the concentration of the boron source in the plating solution, substantially correct compensation of the donor action of the phosphorus contamination is obtained simultaneously throughout that region.

I claim:

1. The method of forming a substantially ohmic contact on a surface of p-type silicon, said method comprising contacting the surface with an aqueous solution containing a reducible nickel salt, an alkali metal hypophosphite and a source of boron atoms to deposit simultaneously on said surface a layer of metallic nickel and relatively minor proportions of phosphorus atoms and boron atoms, the concentration of the boron source in the solution being sufficient that the deposited boron atoms compensate electrically the deposited phosphorus atoms.

2. The method of forming a substantially ohmic contact on a surface of p-type silicon, said method comprising contacting the surface with an aqueous solution containing a reducible nickel salt, an alkali metal hypophosphite and a source of boron atoms to deposit simultaneously on said surface a layer of metallic nickel and relatively minor proportions of phosphorus atoms and boron atoms, the concentration of the boron source in the solution being sufficient that the deposited boron atoms compensate electrically the deposited phosphorus atoms, and firing the coated silicon to bond the deposited nickel to the silicon surface, the phosphorus and boron atoms diffusing into the silicon substantially equally during said firing.

References Cited by the Examiner

UNITED STATES PATENTS

| | | | |
|---|---|---|---|
| 2,795,040 | 6/57 | Antel et al. | 29—504 X |
| 2,874,341 | 2/59 | Biondi et al. | 29—504 X |
| 2,995,475 | 8/61 | Sharpless. | |

JOHN F. CAMPBELL, *Primary Examiner.*